United States Patent [19]
Westfall

[11] Patent Number: 4,632,736
[45] Date of Patent: Dec. 30, 1986

[54] ELECTROLYTIC PREPARATION OF TIN

[76] Inventor: Richard M. Westfall, 4838 Stuart St., Denver, Colo. 80212

[21] Appl. No.: 736,465

[22] Filed: May 21, 1985

Related U.S. Application Data

[63] Continuation of Ser. No. 391,982, Jun. 25, 1982, abandoned.

[51] Int. Cl.$^4$ ............................................. C25C 1/00
[52] U.S. Cl. ................................. 204/59 M; 204/120; 204/122; 156/600; 156/602; 156/608; 156/621
[58] Field of Search .................... 204/120, 122, 59 M, 204/59 R, 15, 281; 156/600, 602, 608, 621

[56] References Cited

U.S. PATENT DOCUMENTS

| | | | |
|---|---|---|---|
| 2,569,367 | 9/1951 | Bradner et al. | 204/281 |
| 4,186,045 | 1/1980 | Gatos et al. | 150/602 |
| 4,521,499 | 6/1985 | Switzer | 204/59 R |

OTHER PUBLICATIONS

"Solution Crystal Growth of Ionic Salts by Electrolytic, Solvent Decomp.", by M. Delfino, J. Crystal Growth, 32 #3 (Mar.), 1976, pp. 378-380.
"Electrochem. Growth of Crystals from Electrolyte Solutions", by A. D. Franklin, J. Crystal Growth, 34 #2 (Jul.), 1976, pp. 245-247.
Crystal Growth by Electrolytic Concentration", by I. M. Rowe et al., J. Crystal Growth 34 #2 (Jul.), 1976, pp. 173-176.

*Primary Examiner*—R. L. Andrews
*Attorney, Agent, or Firm*—Klaas & Law

[57] ABSTRACT

Electrolytic processes for the growth of single crystal tin or other elemental or compound cystals, with or without the use of a substrate. Cubic forms of alpha-tin and tetragonal forms of beta-tin are grown using a shaped anode and a pointed cathode to provide electrical geometric fields within an electrodeposition system to enhance the growth of the desired crystalline tin.

The single crystal cubic tin is preferred because it provides an excellent epitaxial substrate for the deposition of various binary, ternary, and quaternary semiconductors. Combinations of the cubic alpha-tin with the present binary and ternary semiconductors in several forms of photovoltaic cells and infrared detectors are set forth.

13 Claims, 7 Drawing Figures

ELECTROLYTIC PREPARATION OF TIN

This is a continuation of patent application Ser. No. 391,982, filed June 25, 1982, now abandoned.

BACKGROUND OF THE INVENTION

1. Field of the Invention

The present invention relates to the electrodeposition of single crystal tin, doped tin and other single crystals by electrolysis from electrolytic baths containing tin or other cations. The invention also relates to the use of the resulting material, for example, as infrared detectors or as an epitaxial substrate which can be used to provide good single crystalline tin material for epitaxial growth of certain semiconductors, and to the use of the resulting systems as, for example, photovoltaic cells or infrared detectors. Electrodeposition of semiconductor materials such as CdTe or HgTe on the tin material is also taught.

2. Description of the Prior Art

The electrodeposition of polycrystalline tin and doped tin is now broadly known in the art. Many standard tin plating baths, both acid and alkaline, with or without various additives have been employed to achieve results such as brightening, leveling, adhesion to the cathode, superconductivity, as well as other objectives. When such additives are used they often tend to insure that the tin deposits are polycrystalline, and thus flat or bright, rather than single crystal. However, in substantially each and every one of these prior art tin electrodeposition processes, the tin has been deposited directly onto a cathodic substrate. This has also consistently resulted in the production of tin that is polycrystalline, and that includes, in both an "electrical" and "crystallographic" sense, voids, misalignments, and discontinuities which render the tin inefficient for use as an oriented epitaxial substrate or as an electrical contact.

Tin has been one of several conductive metals which has been found to be useful as a nucleating surface possessing favorable electrical characteristics for use with semiconductive materials. However, the use of most prior art tin with semiconductor materials has not provided either single crystal epitaxy or good electrical contact, thus reducing device efficiency. This inefficiency has been due to discontinuous surface morphology, voids, and misalignments that polycrystalline tin provides to semiconductor materials.

Electrodeposition of various semiconductor materials, such as HgTe or CdTe, has been attempted and reported in the past. However, due to the substantial differences among the reduction potentials of Hg, Cd, and Te, the ability to deposit stoichiometric HgTe, CdTe, or ternary mixture compounds from prior systems is suspect. The ability to electrodeposit stoichiometric HgTe on single crystal cubic tin has not been previously reported. The same problems have been noted as to compounds of Group III and Group V materials.

Accordingly, it is an object of this invention to provide processes for the electrodeposition of single crystal tin that is substantially free of voids, misalignments, and discontinuities.

A further object is to provide tin materials that are capable of more functional epitaxial contact with semiconductor materials.

More specifically, it is an object to provide a process in which single crystal tin so produced can be combined with various semiconductor materials to form a photovoltaic cell or any other device which would benefit from the favorable single crystalline characteristics.

Still another object is to provide processes for the electrodeposition of semiconductor materials, such as compounds of Group III and Group V, HgTe, and CdTe, in true stoichiometric proportions, with appropriate doping.

Another object is to provide the use of doped single crystal tin in an infrared detector system.

Other objects, features, and advantages of this invention will be apparent from the following description, drawings, and examples.

SUMMARY OF THE INVENTION

The process of the present invention incorporates several entirely new and different approaches to the production of single crystal tin or doped tin in cubic or tetragonal form, and to the use of the cubic form as an epitaxial substrate and electrical contact for cubic semiconductor materials and of the doped cubic form in infrared detectors. It provides a simple and economical procedure based on principals that enhance the natural tendency for single crystal tin growth. It also discloses means for growing single crystal structures of other elements and compounds. It also provides new procedures for the electrodeposition of compound semiconductor materials in predictable and precise stoichiometric proportions.

This invention permits the production of cubic and tetragonal single crystal tin, with both forms being substantially free of voids, misalignments, and discontinuities, and with the cubic or alpha form having an epitaxial surface which is capable of making exceedingly good epitaxial and electrical contact with many semiconductor materials. Such single crystal cubic alpha-tin has been difficult to produce in the past.

In its simplest form, the process of the present invention comprises the steps of forming a bath containing cations of tin and anions of at least two ionic characters. "Ionic character", as used herein, is determined by the ionic size, electric dipole strength, and ionic charge of an anion. In preferred embodiments, the bath is also substantially saturated with tin cations, as well as having the complementary high concentration of anions having at least two different ionic characters. The bath is then used with at least two electrodes which provide current to the bath. One electrode is a cathode having a tip and another electrode is a shaped anode. When the bath is supplied with electric current which passes between the electrodes, the tin cations in the solution are reduced at the cathode as a single crystal tin deposit suspended from the tip of the cathode, while tin metal is oxidized to tin cations at the anode.

As already indicated, in preferred embodiments two or more anions of different ionic character are included in the bath. Additionally, in preferred embodiments, the cathode is of inert material and has its tip sharpened to a fine point, while the anode is of substantially pure metallic tin. Such an anode is consumed during electrodeposition and thus replenishes the tin cations in the bath. In preferred embodiments the anode is shaped in such a way that, in conjunction with the cathode, it generates a shaped electrical field. This provides a geometry for cation transport which enhances or reinforces the desired growth shape or character of the single crystal tin being produced. Additionally, such an arrangement provides a system in which the surface area of the anode is much greater than that of the cathode, providing a super-saturation of tin cations. For example, a V-shaped anode, having its legs separated at an angle of from about 45° to about 90° and with the cathode intersecting its legs, provides an electrical field having a geometry that enhances the growth of either cubic or tetragonal single crystal tin, depending on the temperature of nucleation. Such an arrangement, in combination with the control of the nucleation and deposition of tin so that it occurs only at the tip of the cathode, provides a favorable environment for the formation and subsequent growth of the single crystal tin. Furthermore, the use of a pointed cathode substantially minimizes any influences that the crystal structure or epitaxy of the cathode might otherwise exert on the tin during its formation. Additionally, the use of a pointed cathode, in which a single crystal dominates, allows adjustment of the configuration of the field which is applied to the crystal while it is being produced, thereby making it possible to provide a field pattern from the cathode that is substantially compatible with the preferred structure of the crystal whose growth is desired.

While in the preferred embodiments of the present invention the single crystal tin is grown without a supporting substrate, it is possible to produce useful polycrystalline tin as a continuous coating deposited on a cathode.

Many of the conditions under which the process of single crystal tin formation is carried out in the present invention are not critical, while others are somewhat more demanding. For example, it may be possible to grow single crystal tin from the tip of any electrode; however, thus far it has been found to be easier to nucleate single crystal tin at the tip of a pointed cathode. In a similar manner, once single crystal growth has been initiated, the shape of the anode may not be critical. However, it has been determined that the use of a V-shaped anode having a large surface area enhances the rate of growth of the crystal and helps to provide geometric electric fields that favor uniform single crystal nucleation. Tin having good crystalline morphology and integrity is thereby provided by the process of the present invention.

The temperature of the tin bath of the process of the present invention is important in determining the form of tin produced by the process. Baths having temperatures below about 13.2° C. tend to produce cubic alpha-tin. Such cubic single crystal tin is thermodynamically stable in the pure form only below about 13.2° C. Baths having temperatures greater than about 13.2° C. favor the production of tetragonal single crystal beta-tin. The bath temperature employed may vary somewhat, depending upon other conditions, including the pressure on the system, and by the inclusion of dopant materials in the tin cation bath. For example, the use of small amounts of certain dopants, such as Ge, allows the production of cubic alpha-tin alloys at temperatures somewhat in excess of 13.2° C.

Once single crystal alpha-tin growth has been initiated at the tip of the cathode, it tends to continue at and suspend from the tip of the cathode along a single or multiplicity of twinning planes, a typical twinning plane being substantially an extension of the point of the cathode. Due to the single crystal nature of the deposit, it tends to remain in a flat or ribbon shape, although it grows outwardly from the twinning plane as the deposition process continues. Where the process of the present invention uses the geometric field provided by a pointed cathode and a V-shaped anode, the benefit of such fields may be best continued and maintained by slowly and continuously moving the tin ribbon crystal within the bath as it is formed, so that the leading edge of the crystal (that is, the edge which is farthest from the point of the cathode) is maintained in a substantially constant position, vis-a-vis the V-shaped anode. Such positioning, if properly controlled, provides a substantially constant geometric electrical field which enhances uniform nucleation during the growth and shaping of the crystal.

Where the process has been used to provide cubic alpha-tin, the resulting single crystal ribbon provides an excellent substrate for use with various semiconductor materials. For example, the deposition of HgTe p+ semiconductor material, whether by evaporation, electrodeposition, melting, vacuum deposition, sputtering, or other coating techniques, onto the cubic alpha-tin will result in about a 99% or better matching of the crystal structure between the single crystal cubic alpha-tin and the HgTe material. This provides good contact between the tin and HgTe, and where, as in the present invention, the tin is substantially free of voids, misalignments, and discontinuities, the mobilities and thus the semiconductor electrical efficiency of the combination are greatly enhanced. In preferred embodiments, material such as HgTe is electrodeposited on the tin in accordance with the teaching of the present invention. Additionally, the deposition of p-type semiconductor material such as CdTe on the HgTe layer carried by the single crystal cubic alpha-tin, whether by evaporation, electrodeposition, or other processes, results also in a good epitaxial match between the HgTe and CdTe. Now, the subsequent deposition of a material such as CdS or ZnSe, for example by vacuum deposition, onto the CdTe, and the deposition of a metal grid or metal oxide as a front contact, can result in a highly efficient photovoltaic cell.

Substantially, any semiconductor material having a cubic lattice structure will make excellent epitaxial and therefore electrical contact with the cubic single crystal alpha-tin produced by the present invention. However, Group IIB-Group VIA semiconductive compounds, including oxides, sulfides, selenides or tellurides of zinc, cadmium or mercury can produce excellent matching to the single crystal cubic tin or tin compounds.

In a similar manner, the process of the present invention can produce germanium-doped single crystal cubic alpha-tin inexpensively and efficiently to provide, for example, materials useful as infrared detectors.

DETAILED DESCRIPTION

Before proceeding with the description of the various exemplary embodiments of the invention, the underlying concept will be first described.

In general, photovoltaic cells, according to the present invention, comprise a front contact on a layer of CdS or ZnSe n-type semiconductor in surface contact with a photovoltaic absorbing p-type semiconductor layer such as CdTe. The CdTe is in surface contact with the degeneratively-doped p+-type semi-metal HgTe, on a suitable back contact. The contact between these layers creates a photovoltaic junction in the region of their interface. This structure is of the p+/p/n type, and the mechanism of photovoltaic generation involves the formation of electron hole pairs in the CdTe layer in response to the action of incident illumination. The minority charge carriers diffuse or drift across the junction, thus creating a potential difference, which in turn causes an electric current to flow in an external circuit connected by suitable electrical contacts to either side of the semiconductor sandwich. Similarly, an HgTe layer in contact with the CdTe provides a back surface field in the CdTe layer, and single crystal alpha-tin in contact with the HgTe layer provides an electrode which is expected to provide the necessary back electrical contact with the HgTe as well as a favorable surface for epitaxial nucleation of the HgTe. Likewise, a CdS or ZnSe layer can provide a depletion width, or space charge layer, in the CdTe which will be an advantage in the finished cell. This combination of properties should enhance the overall efficiency of such a photovoltaic cell.

Figure 1:
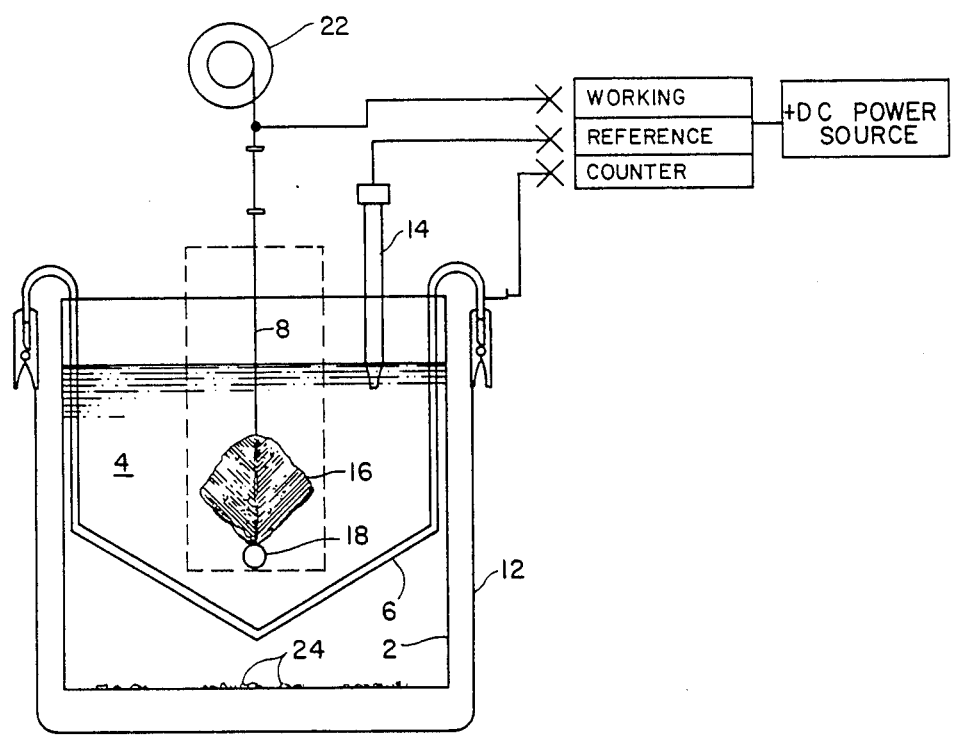
FIG. 1 is a diagrammatic representation of an electroplating system for use in the present invention.

Referring now to FIG. 1, a preferred tin electroplating system is shown which includes container 2 into which bath 4 is placed. Within container 2 is V-shaped anode 6 and pointed cathode 8. Anode 6 and cathode 8 are connected electrically to a source of D.C. electric current (not shown). In preferred embodiments voltage equalization connection 12 is connected between the two legs of anode 6. Additionally, as means for controlling and adjusting the activity of the plating system, reference electrode 14 is operatively inserted into the bath. Representative single crystal tin deposit 16 is shown suspended from the tip of cathode 8.

In one preferred embodiment of the electroplating system of the present invention, a light source 18 (such as an LED) is aimed at a detector (not shown) and both are located so that the light beam is interrupted when single crystal tin deposit 16 grows to a certain predetermined length. Upon interruption of the light beam to the detector, feedback from the light source detector is provided to operate stepping motor 22 which is mechanically connected to cathode 8, so that cathode 8 and suspended crystal 16 are incrementally lifted. This arrangement provides a substantially constant relationship between the leading edge of crystal 16 and anode 6.

Figure 2:
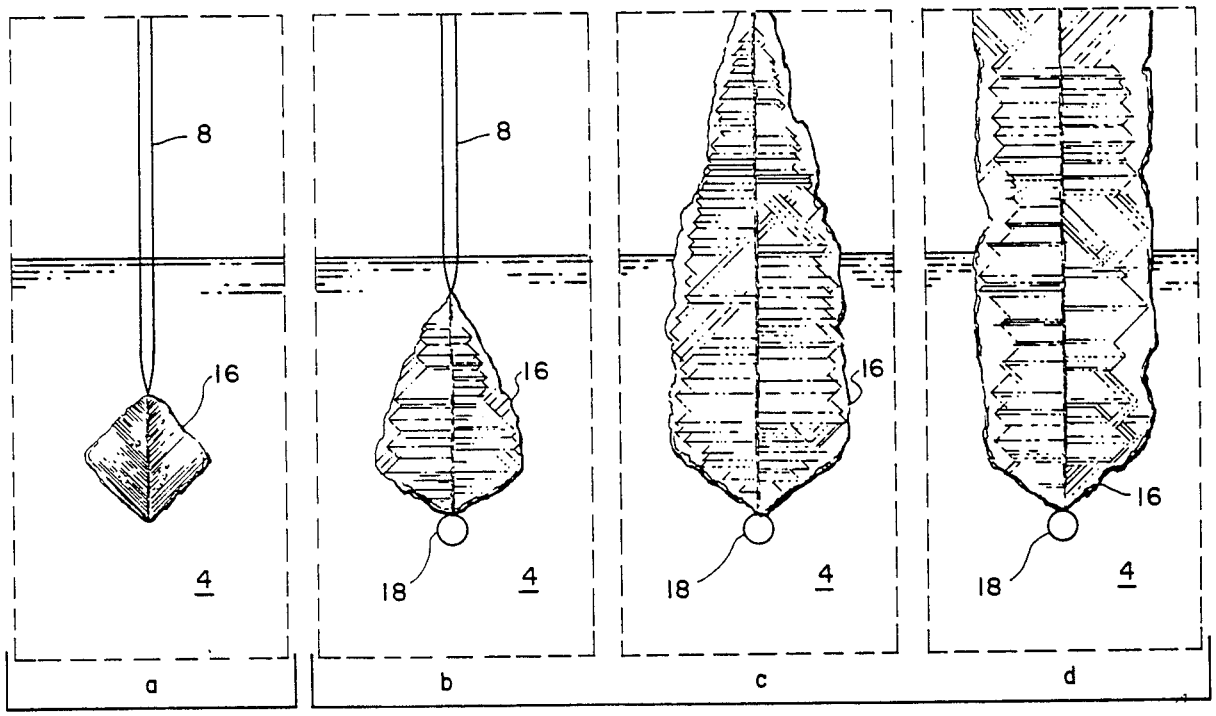
FIGS. 2a–2d represent various stages of single crystal alpha-tin growth using the process of the present invention.

Referring now to FIG. 2a, we see the primary nucleation demonstrated by region "a" of the current-voltage (I-V) curves shown in FIG. 3, and discussed in further detail below. This square morphology is maintained throughout region "a" and the cubic square of FIG. 2a is seen to simply increase in dimension.

Referring to FIGS. 2b-2d, various stages of ribbon growth are shown. The growth of crystalline ribbon proceeds in region "b" of the I-V curve of FIG. 3. The morphology shown in FIGS. 2b-2d is indicative of a central twinning plane with many perpendicular twinning planes along its length. It is seen that each twinning plane ends in an "arrowhead" shape. The occurrence of predetermined morphological characteristics such as are shown in FIG. 2a, and in preferred embodiments in FIGS. 2b-2d, is seen to correlate with the reduction potential of the cathode used.

While not shown, in preferred embodiments a thermostatic control system is used in conjunction with the plating cell, to control the temperature, for example, above or below about 13.2° C., to provide respectively for either tetragonal single crystal beta-tin or cubic single crystal alpha-tin.

In preferred embodiments, anode 6 is prepared from substantially pure metallic tin rods. If such tin rods are not available, they can be easily produced from any source of pure metallic tin using, for example, appropriate melting and forming techniques. The tin anode, regardless of its shape or location, also serves to purify by substitution and replenish the bath by continuously releasing tin cations during the operation of the electroplating system.

Tin Plating Baths and Plating Processes

Figure 3:
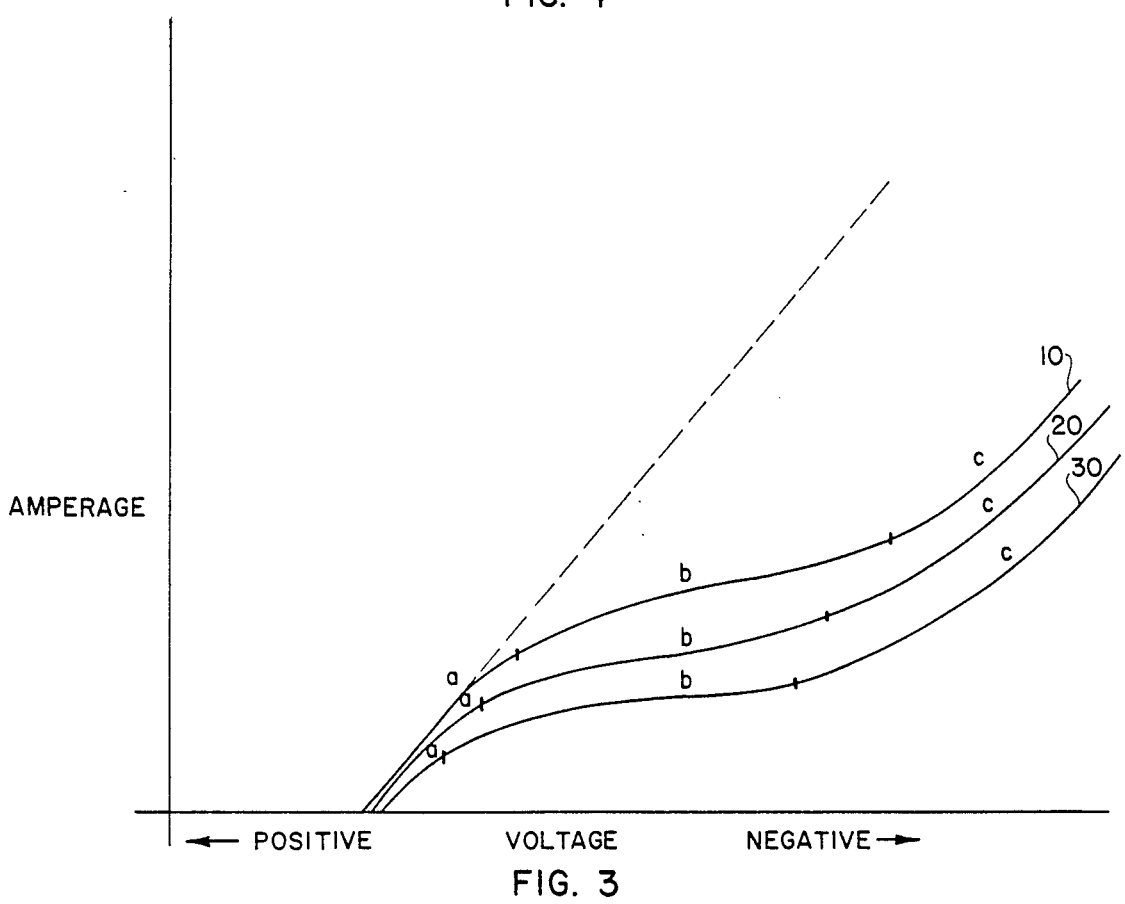

Many forms of tin bath can be used successfully in the practice of the present invention following the operating parameters described herein and with reference to FIG. 3. As explained below, the higher the tin cation concentration, the more efficiently the plating bath will operate. The three curves in the graph of FIG. 3 show the relationship of applied voltage and amperage for a variety of tin cation concentrations. The curve labeled 10 is indicative of the highest, and preferably a saturated, cation concentration, and is further indicative of the electrolyte characteristics in preferred embodiments of the present invention. The curves labeled 20 and 30, respectively, show less concentrated and less favorable electrolytic characteristics.

For example, one suitable plating bath, substantially corresponding to curve 10 is prepared by providing an acid mixture of 100 ml. each of concentrated $H_2SO_4$, concentrated HCl, and concentrated HBr, to which mixture is added pellets of pure metallic tin. Initially the bath is found to bubble vigorously as a result of the decomposition of the tin and the generation of hydrogen gas. However, after dissolution is complete, the generation of hydrogen will cease. Additional undissolved tin 24 is maintained in the bottom of container 2. The tin dissolution process may be speeded by either heating the bath or allowing the exothermic heat of reaction to heat the bath. However, in the presently preferred embodiments in which it is desired to produce cubic single crystal alpha-tin, a thermostatic control system, not shown, surrounding container 2 will be used to maintain the temperature of bath 4 below about 13.2° C. during the electrodeposition process.

Based on what is understood to be the mechanism of the plating cell, other acids or salts could be used in the cell to produce similar results with the tin cations. Substantially any acid or salt, inorganic or organic, that is stable at the temperatures at which the bath will operate is now believed to be operable in the present process. However, it has been determined that nitrate-producing acids and salts are detrimental to the system and should not be used. Additionally, a combination of anions having different ionic character is desired. Anions of different ionic character provide increased polarization, and therefore good conductivity, diffusion, and plating activity to the system of the present invention. The use of such mixed anions helps to avoid the build-up of diffusion layers around the electrodes. Such diffusion layers, caused by diffusion limitations, might otherwise slow reduction and the nucleation process.

After the bath of the present invention has been formed, it is preferably continuously stirred and filtered during plating operations. Where it is intended to form tetragonal beta-tin, the bath should be heated above 13.2° C. Where it is intended to form cubic alpha-tin, the bath can be temperature controlled below about 13.2° C. by use of a thermostatic control system, or other means, not shown.

Figure 4:
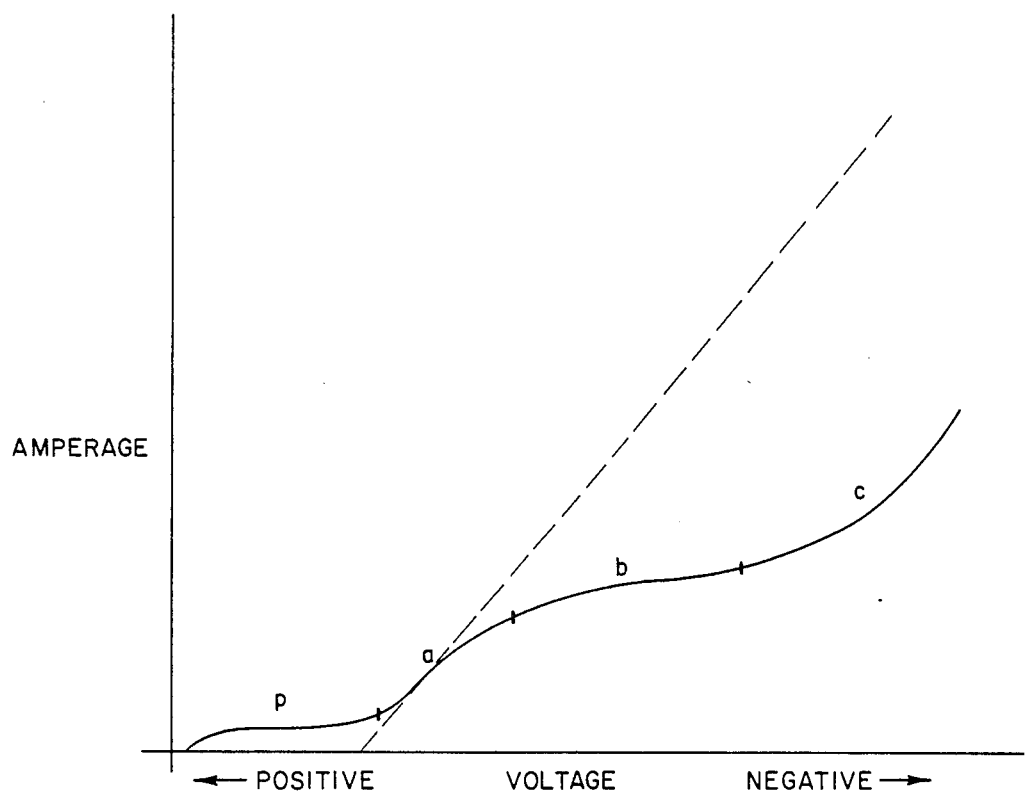
FIGS. 3 and 4 provide graphic data concerning the parameters of the practice of the present invention.

As an initial operation before the start of tin electrodeposition, the bath of the present invention is preferably electropurified. Referring to FIG. 4, electropurification, occurring in regions "p" and a portion of "a" and perhaps "b", is obtained by providing a current to the cell at a voltage potential below that necessary to reduce tin cations at the desired and expected nucleation rate to deposit tin. During this operation, cations in the bath having a higher reduction potential than tin are attracted to the cathode, reduced, and thereby removed from the solution. Incidental with the operation of this purification step, the tin anode 6 in FIG. 1, is oxidized to generate additional tin cations entering the bath to "replace" the impurities being removed. Referring again to FIG. 4, region "p" of the plating bath's current-voltage curve is indicative of the impurities. Region "a" begins at the reduction potential for tin where the curve is seen to turn sharply upward and corresponds to region "a" on the curves of FIG. 3. The abruptness of this turn-on potential shown in FIG. 4 indicates that the bath has reached a state of substantially complete purification. The time required to complete electropurification will depend on the magnitude of current used and the amount of impurities in the bath.

After bath electropurification has been completed, dopants are added to the bath if desired. Dopants, such as Ge, As, and Sb, may be a desirable addition to the bath to somewhat lessen the temperature sensitivity of the crystals produced by the bath, especially where the tin to be produced is to be of the cubic crystal type. The use of small quantities of dopants of this type, which have larger atomic radii than the tin, stabilize the crystal formed by providing atoms in the plated material which pin the slippage planes of the crystal. By pinning the slippage planes, the transition from cubic to tetragonal tin at temperatures above 13.2° C. is hindered. In addition to providing pinning, Ge further decreases temperature sensitivity because it has a higher electronegativity and has no tetragonal form; it increases the stability of cubic tin. In addition to the dopants mentioned, any other dopant having an atomic radius greater than that of tin, as well as an electronegativity greater than that of the tin cations, may be used to serve the function of reducing the temperature sensitivity of the deposited tin material.

After the plating system of the present invention has been thus prepared, cathode 8 is preferably lowered into the bath so that it is immersed in bath 4 to the extent of from about 2 mm to about 6 mm of its length. Cathode 8 is connected to the negative pole or working electrode connection of the D.C. power source. Anode 6 will have been previously placed into container 2 and connected to the positive pole or counter electrode connection of the D.C. power source. With the cell so connected and operating with voltage flowing through the bath between electrodes 6 and 8, after the potential at cathode 8 reaches a level of between about (neg.)−0.13 and (neg.)−0.4 volts versus hydrogen, a tin crystal will begin to grow from the tip of cathode 8. Initially, an overpotential is applied. After the growth of a single nucleus is begun, the applied potential is decreased to a predetermined amount, thus encouraging only the formation and growth of the desired crystal morphology. The lower the voltage, the faster tin crystal 16 grows, and the more it tends to grow in the ribbon or leaf-type structure, as opposed to cubic squares.

After crystal growth has been initiated at cathode 8, if more than one tin crystal is found to be growing at the cathode, then all tin crystals but one can be and should be mechanically removed from the cathode. This avoids crystal growth competition between multiple crystals. Once single crystal growth has been started with a single crystal, the production of leaf-like single crystal tin 16 will proceed.

Referring again to FIG. 3 and the representative crystals shown in FIGS. 2a–2d, the growth mechanism of the tin crystals can be understood by referring to the amperage vs. voltage curve shown therein. As shown by the curve of FIG. 3, there are three distinct regions of growth, depending upon the relationship between the amperage and the voltage of the plating system. In region "a", growth is substantially linear and quite rapid, as it is not diffusion-limited and produces the type of crystal shown at FIG. 2a. Primary nucleation of the crystal is the dominating factor controlling growth in region "a". In region "b", the growth is also substantially linear, but not as rapid as in region "a". This is due to the fact that in region "b" crystal growth is somewhat diffusion-limited and produces the type of crystals shown at FIGS. 2b–2d. Some primary nucleation is also believed to occur in region "b". In region "c", growth is less diffusion-limited than in region "b" but, is more limited than in region "a". Secondary nucleation is believed to be taking place in region "c". The break in the curve between regions "b" and "c" is indicative of a phenomenon known as "double layer breakdown". This phenomenon is caused by the presence of a "critical overpotential" which is a phenomenon in which the accumulation of anions and cations forming a double layer of space charge at the cathode is dissipated by voltage overpotential where the space charge layers exceed stable thicknesses and results in a less well defined double layer and therefore less predictable nucleation.

Referring again to FIG. 3, some noteworthy trends are shown to be found in plating baths of various concentrations. The intercepts of the voltage axis indicate relative reduction potentials, which are seen to decrease with lessening concentrations. The duration of regions "a" and "b" is seen to decrease with lessening concentrations. Thus, the most favorable nucleation environment is seen to exist for curve 10 or other comparable high tin cation concentration solutions.

The dashed line shown in both FIGS. 3 and 4 indicates the ideal amperage-voltage curve for a tin cation plating system. Region "a" of each curve falls on or close to this line, with region "b" beginning where diffusion limited statistics begin to cause a deflection that indicates space charge buildup.

Where the single crystal alpha-tin produced by the present invention is intended for use in semiconductor applications, the parameters of the bath are controlled to produce cubic crystals, preferably in the form of cubic squares, or ribbons. When grown slowly in region "a", a square crystalline morphology results. When grown quickly, for example, under the conditions of region "b" of FIG. 4, there forms a series of perpendicular twinning planes in which each leaf is a series of cubic squares which has been grown or generated under a slight plating over-potential condition. These amperage-voltage plating characteristics shown for tin are also seen in most other electrolytic deposition systems.

After the predetermined production of cubic crystals or other forms of single crystal tin according to the present invention, the tin crystal 16 is removed from the cell and, if necessary, trimmed to the desired size and shaped required for its subsequent use.

Alternate Bath

An alternative bath is useful in the practice of the present invention can use substantially pure anhydrous $SnCl_4$ or $SnBr_4$ or mixtures thereof as one source of tin cations. These compounds must, however, be rendered polar prior to the initiation of electrodeposition. To achieve this, they can be mixed, for example, with acids of the type used in the previous bath example. It should be noted that such anhydrous $SnCl_4$, $SnBr_4$ and their mixtures are normally liquid under ambient or close to ambient conditions. As the pure anhydrous $SnCl_4$ or $SnBr_4$ are non-polar, non-ionic, and in fact dielectrics, the addition of polarity and conductivity producing materials to the bath, such as acids or other ionic materials, is essential. As a caution, it should be noted that a bath containing these ingredients will fume vigorously, even under ambient conditions, and should be used in a container modified to prevent personnel coming in contact with the fumes. In all other matters, the use of this alternative bath is essentially the same as the use of the bath previously described.

Photovoltaic Cell

As previously noted, many types of semiconductor devices can be produced using the single crystal alpha-tin produced by the process of the present invention as an electrode. Examples of two photovoltaic cells using single crystal cubic alpha-tin are now set forth.

Figure 5:
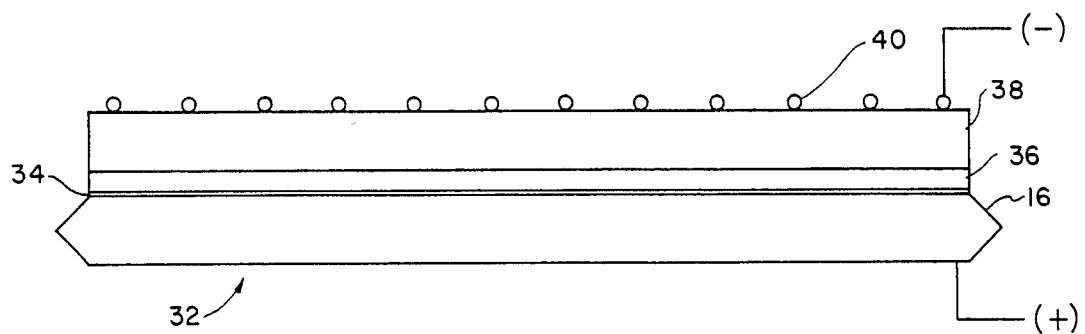
FIG. 5. is a plan view of a photovoltaic cell made according to the present invention, which includes as an electrode single crystal cubic alpha-tin material produced by the process of the present invention.

The photovoltaic cell shown in FIG. 5 is a structure including single crystal cubic alpha-tin 16; HgTe 34; CdTe 36. In the photovoltaic cell shown, two different materials can be coated onto the CdTe 36 of the three layer structure. In one form of photovoltaic cell, the photovoltaic material in fourth layer 38 can be CdS, while in the other form of photovoltaic cell, the layer 38 of photovoltaic material can be ZnSe. To fourth layer 38 contact grid 40 is applied. The general structure of such a cell 32 is set forth diagrammatically in FIG. 5.

In the production of each of these photovoltaic cells, the single crystal cubic alpha-tin 16 is used as a single-crystalline substrate for the epitaxial growth of HgTe 34. In a similar manner, HgTe layer 34, once deposited, is then used as an epitaxial surface for the deposition of CdTe layer 36. The HgTe layer 34 may be provided by electrodeposition, evaporation, vacuum deposition, sputtering or other suitable coating techniques, although in preferred embodiments care will be taken to assure that the source of HgTe material is stoichiometric so that true binary crystals of stoichiometric HgTe are formed. Regardless of the coating technique used, HgTe layer 34 will tend to make excellent electrical contact with the single crystal cubic alpha-tin layer 16. In a similar manner, the CdTe layer 36 may be deposited on the HgTe layer 34 by electrodeposition, evaporation or other means.

Where fourth layer 38 is CdS, it is preferably vapor deposited on CdTe layer 36. However, where the fourth layer 38 is ZnSe, it may be electrolytically deposited onto CdTe layer 36.

In addition to the excellent electrical contact characteristics found to exist between HgTe layer 34 and both tin layer 16 and CdTe layer 36, HgTe layer 34 also provides a back surface field in the CdTe, which increases the carrier collection efficiency at the back of cell 32. This will provide a greater internal quantum efficiency as well as greater electric current production in the cell when exposed to light.

In the operation of the photovoltaic cell 32 of FIG. 5, CdTe layer 36 serves as the principal radiation absorbing layer and produces virtually all of the power developed by the cell. CdS or ZnSe layer 38 serves to provide a space charged region in front of CdTe layer 36 and also provides current collection. Layer 38, whether CdS or ZnSe, also provides current collection for the photogenerated carriers produced in the CdTe layer by radiation. Various dopants may be used in each of the layers of photovoltaic cell 32. Other semiconductor materials as desired or required may be used.

It has been calculated that the photovoltaic cell in which CdS is fourth layer 38 will produce maximum theoretical efficiency of about 21% conversion of the standard or AM1 illumination, while the photovoltaic cell in which the ZnSe is fourth layer 38 will produce about 23% theoretical efficiency. It is believed that the reason that these cells may provide such high efficiency is due to the complementary nature of the crystal structures of the various layers. The first three layers, cubic alpha-tin 16, HgTe 34, and CdTe 36, all have cubic lattice constants that mismatch by less than 1% and thus provide excellent lattice heterojunctions and excellent electrical contact. Theoretically, the lattices of both CdS and ZnSe as layer 38 differ from that of CdTe layer 36, on which they are coated. Thus substantial lattice mismatch would be expected to exist between third layer 36 and fourth layer 38. However, the morphology of third layer CdTe 36 is expected to influence the crystalline epitaxial growth of fourth layer 38 and provide a satisfactory crystal lattice match between layers 36 and 38.

In operation, photovoltaic cell 32 will produce electric current. This occurs when light from any source passes through front contact 40 and impinges on front layer 38 of cell 32. Photons that are not absorbed by layer 38 and that are not reflected from it will be absorbed by layer 36. Photons having energy above the bandgap of the material in layer 38 (either the CdS or ZnSe) will be either absorbed or reflected by this n-type semiconductor layer. The remaining photons, those having energy below the band gap of the material of layer 38 but above the band gap of CdTe layer 36, will be absorbed by CdTe layer 36. Controlling the electrical properties of CdTe layer 36, HgTe layer 34, and fourth layer 38 causes CdTe layer 36 to have space charge regions at both of its ends. This is achieved by maintaining CdTe layer 36 at a higher resistivity and a lower carrier density than either HgTe layer 34 or the n-type material of layer 38. This will thus cause the resistivity of CdTe layer 36 to be greater than the resistivity of either the HgTe layer 34 or of the CdS or ZnSe layer 38. Therefore, a space charge region is induced to exist throughout CdTe absorbing layer 36 with the result that layer 36 posesses a highly efficient form of internal electric field for maximum internal quantum efficiency.

ELECTROLYTIC PRODUCTION OF HgTe

As has been noted, when it is desired to use HgTe as a p-type semiconductor material associated with the single crystal cubic alpha-tin produced according to one teaching of the present invention, it may be produced by electroplating, evaporation, vacuum deposition, sputtering, or other art known means. However, as tin, and especially tin alloys, have low melting temperatures, in the range of about 220° C., and transition of the tin from cubic to tetragonal form occurs at about 13.2° C., any of the HgTe production techniques that result in the application or transfer of heat to the tin, and especially to cubic tin, may result in either an unwanted phase change in the tin to its tetragonal form, or in the deformation or melting of the tin. Therefore, the application of HgTe to the tin by non-heating techniques is to be preferred.

The preferred non-heating technique for the preparation of HgTe is by electrodeposition. However, where the preparation of stoichiometric HgTe is desired, it has been difficult to produce using known prior art electrodeposition techniques due to the fact that the reduction potentials of Hg cations and of Te cations are separated from one another. This means that in a bath containing both Hg cations and Te cations, a much greater amount of Hg than of Te will be reduced. For example, electrodeposition from a bath containing about equal amounts of Hg cations and Te cations will produce a compound $Hg_nTe$, where n is a large integer.

It has now been determined that stoichiometric HgTe may be produced by electrodeposition by controlling concentrations of the Hg cations and Te cations. By the use of a relatively insoluble source of Hg cation, such as HgO or HgI in the presence of additional I anions, and a highly soluble source of Te cation, electrodeposition of stoichiometric HgTe may be achieved. For example, a bath including Te metal, $TeO_2$, $TeI_4$, $HgI_2$ or HgO, concentrated $H_2SO_4$ and HI will provide a large ratio of Te cations to Hg cations. At a plating potential in the range of about (pos.)0.6 V to about 0.0 V versus hydrogen, stoichiometric HgTe may be produced from this bath.

The electrodeposition of HgTe on one surface of cubic single crystal alpha-tin produced in accordance with the present invention requires only that the tin be cleaned, coated on one surface with a dielectric or photoresist type material, and made the cathode in a plating system. The pH of the bath will be acid, in a range of from 0 to about 3.0. In preferred practice a reference electrode will be used with the system to control the plating current and potential. When HgTe is epitaxially electrodeposited directly on single crystal cubic alpha-tin, the HgTe deposit is also single crystal, the lattice match with the tin will be about 99%, and the epitaxial match and electrical contact will be sufficient to achieve the described advantages of the present invention.

ELECTROLYTIC PRODUCTION OF CdTe

As with HgTe, the electrodeposition of CdTe is the preferred technique of coating CdTe on HgTe. Also, analogous to HgTe, the reduction potential of Te is quite a bit higher than that of Cd. Using normal plating procedures, stoichiometric CdTe will not be produced; rather, the result will be $CdTe_n$, where n is a large integer. It has now been discovered that the production of stoichiometric CdTe is favored, in acid solutions, by the use of concentrations of Cd cations that are about at least $10^4$ to about $10^7$ times greater than the concentrations of Te cations. The preferred source of Cd cations is cadmium chlorate and/or the nitrate, while the source of Te cations is tellurium oxide. Cd cation concentrations of about 20 to about 35 molal are preferred. Using such a plating bath to deposit stoichiometric CdTe on a previously deposited HgTe coating should result in about 99% lattice match between the CdTe and the HgTe. When CdTe is electrodeposited on a single crystal material, such as single crystal HgTe, the resulting CdTe deposit is also single crystal.

INFRARED DETECTORS

Using the techniques of the present invention, various single crystal doped cubic alpha-tin alloys may be produced, having a stoichiometry generally represented as $Sn_xGe_{1-x}$, where x varies from 0 to 1. The actual composition and structure of the alloy is determinative of the electrical and optical absorption characteristics or bandgap of the material. Alloy compositions of from about 50% to about 99% Sn and about 1% to about 50% Ge are contemplated for use as infrared detectors or temperature sensors in conditions ranging from cryogenic to about 600° C. The source technology can be used to produce crystals containing from about 50% to about 99% Ge which can be used to detect temperatures from about 600° C. to about 1360° C.

The desired $Sn_xGe_{1-x}$ alloy will be produced using substantially the same techniques and substantially the same electrodeposition system as has been described above for the production of single crystal alpha-tin. However, germanium cations are added to the electrolytic bath in the proportions required to produce the desired stoichiometry.

The resulting single crystal cubic alpha-$Sn_xGe_{1-x}$ will then be processed to produce the desired p/n junction infrared detector. Techniques for producing such detectors include either diffused homojunction or epitaxial growth methods. For example, in the diffused homojunction method, the single crystal cubic alpha $Sn_xGe_{1-x}$ layer 42 (FIG. 6) is coated on one face with a p-type dopant such as Ga or In which is allowed or caused to diffuse into the $Sn_xGe_{1-x}$ layer 42, to form a back surface field layer 44. A secondary layer 47 can be any suitable electrical contact applied to the back surface 44. This diffusion process also causes exponential distribution of the so-called bulk hole population through $Sn_xGe_{1-x}$ alloy layer 42, with the highest concentration of holes being near the back surface field layer 44. An n-type dopant, either As or Sb, layer 46, is also coated on $Sn_xGe_{1-x}$ layer 42 and caused to diffuse into layer 42, with the result that anion dopants diffuse into the surface to form a n+ degeneratively doped layer. Grid 48, having lead 52, is then attached to layer 46 while lead 54 is attached to contact 47. In the practice of the production of such an infrared detector, it may be desireable to stabilize the $Sn_xGe_{1-x}$ with Group VA dopants.

Figure 7:
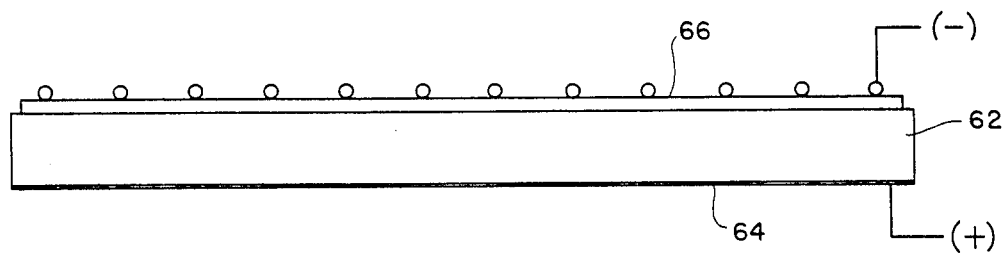
FIGS. 6 and 7 are plan views of infrared detectors using doped single crystal cubic alpha-tin material of the present invention.

Referring to FIG. 7, another form of infrared detector is shown. In this infrared detector, $Sn_xGe_{1-x}$ layer 62, produced in accordance with the practice of the present invention, is initially coated and diffused with p-type dopant material 64 which is caused to diffuse entirely through $Sn_xGe_{1-x}$ layer 62 to the surface opposite from that on which it is shown coated. There, now doped $Sn_xGe_{1-x}$ layer 62 (with diffused p-type dopant from layer 64) is in turn coated with n-type material layer 66, epitaxially grown in situ.

Figure 6:
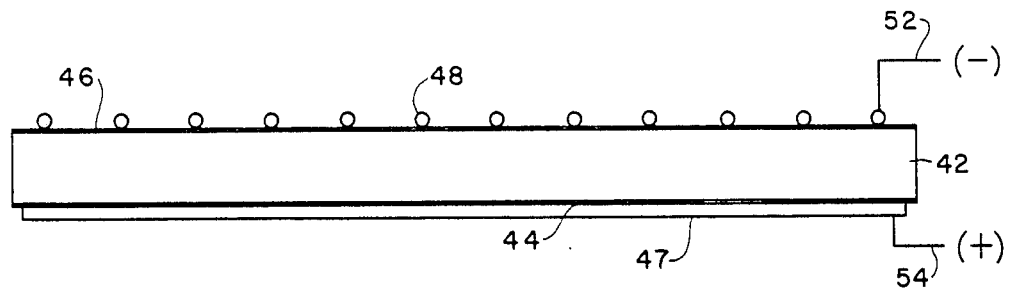

Appropriate transparent or filtering windows, not shown, such as $Hg_xCd_{1-x}Te$, $CdSe_xTe_{1-x}$ or $ZnSe_x$-$Te_{1-x}$ ternary compounds, may be used with the infrared detectors of FIGS. 6 or 7. Other examples are provided in the next section.

ELECTROLYTIC PRODUCTION OF GROUP III–GROUP V SEMICONDUCTOR MATERIALS

Using similar techniques, stoichiometric Group III–Group V semiconductor materials may be produced. To provide specific electrical characteristics (including the capability to use such compounds in photovoltaic cells) or specific spectral filtration characteristics, GaAs, InAs, GaSb, InSb, and ternary mixtures of these compounds can be grown. The possible ternary compounds having the general formulae are $Ga_xIn_{1-x}As$, $Ga_xIn_{1-x}Sb$, $GaAs_xSb_{1-x}$, and $InAs_xSb_{1-x}$, wherein "x" varies from 0 to 1.

As the reduction potentials of As and Sb are quite a bit higher than those of Ga and In, stoichiometric compounds will not be produced if normal plating procedures are used. However, in accordance with the present invention, stoichiometric compounds may be produced by electrodeposition from a bath substantially saturated with Ga and/or In cations and only minor quantities of As and/or Sb cations. Suitable sources of Ga and/or In cations include the halide, nitrate, sulfate, and chlorate salts. The sources of As and/or Sb cations may be their oxides or small concentrations of the soluble salts, including the halides. By controlling the bath so that the concentration of Ga and/or In cations to As and/or Sb cations is about $10^2$ to $10^7$, stoichiometric compounds may be produced. Nitrates and halides must not be mixed, so as to prevent the formation of nitrosyl halide compounds.

While preferred embodiments of the present invention have been described, it is contemplated that these and other modifications and embodiments may be made by those skilled in the art, and it is therefore intended that the scope of the invention and appended claims be construed to include alternative embodiments of the invention, except insofar as it may be limited by the prior art.

What is claimed is:

1. A process for electrolytically producing single crystal tin comprising the steps of:
   forming a bath containing cations of tin and anions selected from the group consisting of sulfate anions, fluoride anions, chloride anions, bromide anions, hydrogen ions, and stable cations having a reduction potential below that of the tin cations;
   immersing a cathode and an anode into said bath, said cathode being shaped in a manner to be capable of providing for nucleation of tin cations on said cathode along at least one crystalline twinning plane;
   passing an electrical current between said anode and said cathode at an applied cathodic potential above the critical overpotential for the composition of said bath; and
   reducing said tin cations at said cathode by the application of said electrical current to thereby form a single crystal tin deposit at the cathode.

2. The process of claim 1 wherein tin cation containing solution contains acid-dissolved metallic tin.

3. The process of claim 1 wherein:
   the source of said tin cations is selected from the group consisting of anhydrous $SnCl_4$ and anhydrous $SnBr_4$ and mixtures thereof.

4. The process of claim 1 wherein:
   said bath is substantially saturated with tin cations.

5. The process of claim 1 wherein:
   said anode is metallic tin.

6. The process of claim 5 wherein:
   said anode has a larger surface area than said cathode.

7. The process of claim 5 wherein:
   an electric reduction potential less than the reduction potential of said tin cations is first passed between said electrodes, whereby cation impurities are removed from said bath thus purifying the bath.

8. The process of claim 1 or 5 wherein:
   a portion of said anode is V-shaped and the said cathode is located in said bath substantially intermediate the legs of said V-shaped portion of said anode.

9. The process of claim 8 wherein:
   said V-shaped portion of said anode forms an angle which coincides substantially with the crystallographic angle of the to-be-deposited tin to thereby provide a shaped electric field between said electrodes which enhances or reinforces said desired crystal growth.

10. The method of claim 1 wherein:
    said plating bath is maintained at temperatures below about 13.2° C. during electrodeposition and the single crystal tin material produced has a substantially cubic crystal lattice.

11. The method of claim 10 wherein:
    As cations or Sb cations are added to said bath to allow the production of single crystal cubic tin material which is stable at temperatures in excess of about 13.2° C.

12. The method of claim 1 wherein:
    the plating bath is maintained at temperatures greater than about 13.2° C. during electrodeposition and the single crystal tin material produced has a substantially tetragonal crystal lattice.

13. A process for electrolytically producing single crystal materials at the tip of a cathode which includes the steps of:
    forming a bath including cations of the to-be-produced material;
    immersing in said bath a pointed cathode and an anode shaped to substantially replicate a portion of the desired to-be-deposited crystal lattice; and
    passing a current between said anode and said cathode to reduce said cations and form a single crystal material at the tip of said cathode.

* * * * *